(12) United States Patent
Ishihara et al.

(10) Patent No.: US 8,645,795 B2
(45) Date of Patent: Feb. 4, 2014

(54) NONVOLATILE SEMICONDUCTOR MEMORY DEVICE

(75) Inventors: Kazuya Ishihara, Osaka (JP); Yoshiaki Tabuchi, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 91 days.

(21) Appl. No.: 13/462,846

(22) Filed: May 3, 2012

(65) Prior Publication Data

US 2012/0297268 A1    Nov. 22, 2012

(30) Foreign Application Priority Data

May 17, 2011 (JP) ................................. 2011-110611

(51) Int. Cl.
*G11C 29/00* (2006.01)

(52) U.S. Cl.
USPC ........... 714/763; 714/758; 714/767; 714/769; 714/764; 714/799; 711/103; 711/102; 711/101; 711/104; 365/100; 365/148

(58) Field of Classification Search
None
See application file for complete search history.

(56) References Cited

U.S. PATENT DOCUMENTS

| | | | |
|---|---|---|---|
| 6,256,762 B1 * | 7/2001 | Beppu ........................... | 714/763 |
| 2005/0229077 A1 | 10/2005 | Takahashi | |
| 2008/0022188 A1 * | 1/2008 | Tamura et al. ................. | 714/763 |
| 2008/0109700 A1 * | 5/2008 | Lee et al. ....................... | 714/758 |
| 2013/0097369 A1 * | 4/2013 | Talagala et al. ............... | 711/103 |

FOREIGN PATENT DOCUMENTS

| | | | | |
|---|---|---|---|---|
| JP | 5-33252 | | 4/1993 | |
| JP | 2002-008317 | * | 1/2002 | ............. G11B 20/10 |
| JP | 2005-004947 | | 1/2005 | |
| JP | 2005-327437 | | 11/2005 | |
| JP | 2006-200929 | * | 7/2006 | ............. G06F 12/16 |
| JP | 2008-27296 | | 2/2008 | |

* cited by examiner

*Primary Examiner* — John Trimmings

(74) *Attorney, Agent, or Firm* — Nixon & Vanderhye, P.C.

(57) ABSTRACT

The present invention provides a nonvolatile semiconductor memory device that can optimize a timing of performing an error detection and correction process to shorten a processing time. Upon receiving a write request to a memory cell array including a variable resistive element where information is stored based on a resistance state of a variable resistor, an input/output buffer outputs write data to a write control unit and an ECC control unit. The write control unit performs a data write process of writing divided data, obtained by dividing the write data into a predetermined number of data, to the databanks. The ECC control unit generates a first error correction code by performing an error correction code generation process to the write data or the divided data, in parallel with the data write process. The write control unit performs a code write process of writing first test data into an ECC bank.

12 Claims, 4 Drawing Sheets

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2011-110611 filed in Japan on May 17, 2011 the entire contents of which are hereby incorporated by reference.

BACKGROUND OF THE INVENTION

1. Field of the Invention

The present invention relates to a nonvolatile semiconductor memory device that includes a memory cell array including a plurality of memory cells each including a variable resistive element which stores information by shifting between a plurality of states an electric resistance of a variable resistor sandwiched between a first electrode and a second electrode, by applying a voltage pulse between the first electrode and the second electrode.

2. Description of the Related Art

In portable electronics devices or mobile devices, a volatile memory such as a low-cost DRAM having a small number of parts and a nonvolatile memory such as a large-capacity and low-cost flash memory are being used, as a main storage memory into which a CPU (Central Processing Unit) can directly perform a write process and a read process. The main storage memory into which a CPU directly performs a write process and a read process is required to be able to realize the write process and the read process at a high speed to shorten a processing time, and is also required to have high reliability with few errors in writing and reading, for usage of the main storage memory. The main storage memory is also required to have small power consumption to extend a using time of an electronics device, and is required to be highly integrated along with downsizing of electronics devices and mobile devices.

Because a volatile memory such as a DRAM requires a refresh operation, reduction of power consumption is difficult, and a using time of electronics devices is limited. Further, a nonvolatile memory such as a flash memory has a problem in its high integration because of a limit to miniaturization. Therefore, there are being progressed development of an MRAM (Magneto-resistive Random Access Memory), a PCRAM (Phase-Change Random Access Memory), a CBRAM (Conductive-Bridging Random Access Memory), and an RRAM (Resistive Random Access Memory) that uses a variable resistive element.

In this case, the RRAM is expected as a promising main storage memory, because the RRAM has a large resistance change and a high-speed write process can be performed, because a random access to a memory cell array is possible, because a constituent material is a binary material that has high affinity with a CMOS process, and because a memory structure is simple and high integration is possible.

The RRAM includes a variable resistive element which is formed by sandwiching a variable resistor between a first electrode and a second electrode, and stores information by shifting an electric resistance of the variable resistor between a plurality of states, by applying a voltage pulse between the first electrode and the second electrode. A write process and a read process of the RRAM are controlled by magnitude of a voltage value of a voltage pulse. Therefore, to prevent an erroneous writing and an erroneous reading, it is desirable that there is a sufficient difference between a voltage value of a voltage pulse that is used in the write process and a voltage value of a voltage pulse that is used in the read process.

However, along with miniaturization and integration in a semiconductor process, a voltage value of a power supply voltage tends to become small. Therefore, a write voltage and a write current that are used for the write process are also required to be reduced. Further, to realize a high-speed read process, it is difficult to reduce a read current that is used for the read process. Therefore, it becomes difficult to secure a sufficient difference between the write voltage and the read voltage. That is, along with miniaturization and integration of elements, when it is not possible to secure a sufficient difference between the write voltage and the read voltage, there is a problem in that a risk of occurrence of an erroneous writing and an erroneous reading becomes high.

Further, along with an increase in capacity, the number of variable resistive elements to be mounted increases, and the number of circuits that receive an unintended load such as a leak current increases. Therefore, there is a risk of occurrence of an erroneous writing. When a read process is continuously performed to a specific memory cell at a considerable number of times, a resistance state of a variable resistor changes due to a read voltage that is applied in the read process, and there is a risk of occurrence of an erroneous reading. That is, the RRAM is also required to have a technology of preventing an erroneous writing and an erroneous reading, in a similar manner to that of other memories.

In the main storage memory, to secure reliability by preventing an erroneous writing and an erroneous reading, an error detection process is conventionally performed (refer to Japanese Patent Application Laid-open Publication No. 2008-27296, for example (hereinafter, "Publicly Known Document 1")).

According to Publicly Known Document 1, both a databank that stores data and an ECC bank that stores an error correction code are configured in the same memory device. With this arrangement, a processing time is shortened, as compared with a case that a databank and an ECC bank are built in different memory devices.

When an RRAM is used for a main storage memory into which the CPU directly performs writing and reading of data, reliability is very important. Therefore, it is desirable to perform an error detection and correction process in high precision, by using a Reed-Solomon code, for example. However, an error detection and correction process in high precision that uses a Reed-Solomon code tends to take a long time for the error detection and correction process, and there is a risk of increasing a time required for the write process and the read process.

In particular, in the RRAM, a speed of a data write process is faster than that in other memories. Therefore, a time required for the error correction and detection process gives a large influence to a processing speed of an overall write process and to a processing speed of an overall read process. Accordingly, shortening of a time required for the error detection and correction process is more desired.

According to the memory device in Publicly Known Document 1, a processing time is shortened, by configuring both the databank and the ECC bank in the same memory device, from a viewpoint of shortening an access time to the memory device. However, further shortening of the processing time is required.

SUMMARY OF THE INVENTION

The present invention has been made in the light of the above problems, and an object of thereof is to provide a nonvolatile semiconductor memory device that can optimize a timing of performing an error detection and correction process of a write process and a read process and that can further shorten a processing time.

To achieve the above object, a nonvolatile semiconductor memory device according to the present invention includes a memory cell array that includes a plurality of memory cells each including a variable resistive element which has a variable resistor sandwiched between a first electrode and a second electrode and stores information by shifting an electric resistance of the variable resistor between a plurality of states by applying a voltage pulse between the first electrode and the second electrode, an input/output buffer that receives write data in units of bits the number of which is set in advance, and that outputs read data which is read from the memory cell array, and a memory control unit that includes a write control unit which controls a write process to the memory cell array, a read control unit which controls a read process to the memory cell array, and an ECC control unit which can perform an error correction code generation process of generating an error correction code of a predetermined system and an error correction process, the memory cell array including the predetermined number of databanks that store data, and an ECC bank that stores test data in the error correction code which is generated by the error correction code generation process, wherein upon receiving a write request to the memory cell array, the input/output buffer outputs the write data received, to the write control unit and the ECC control unit, the write control unit generates divided data by dividing the write data into the predetermined number of data, and performs a data write process of writing the divided data to each of the databanks, based on a write address which is assigned by the write request, the ECC control unit generates a first error correction code by performing the error correction code generation process to either the write data or each of the divided data, in parallel with the data write process in the write control unit, and transfers first test data in the first error correction code to the write control unit, and the write control unit receives the first test data from the ECC control unit, and performs a code write process of writing the first test data into the ECC bank.

Preferably, when the error correction code generation process is performed to the write data, the write control unit performs a first code write process of writing the test data in the first error correction code to the write data, into the ECC bank, as the code write process, and when the error correction code generation process is performed to each of the divided data, the write control unit performs a second code write process of writing the test data in the first error correction code which is generated for each of the divided data, into the ECC bank, as the code write process.

Preferably, the write control unit is configured to continuously perform a plurality of write requests to the memory cell array, and before the data write process and the code write process to a predetermined one of the write requests ends, the write control unit starts execution of the data write process and the code write process to a next write request at a time point when it becomes possible to perform the data write process and the code write process to the next write request.

Preferably, when a read request to the memory cell array is received, the read control unit performs a data read process of reading each of the divided data from each of the databanks based on a read address assigned by the read request and transferring the read divided data to the ECC control unit, and after the execution of the data read process, performs a code read process of reading the first test data corresponding to read data including the divided data which are read in the data read process or to each of the divided data, from the ECC bank, the ECC control unit generates a second error correction code by performing the error correction code generation process to the read data or each of the divided data which is read in the data read process, performs a code comparison process of comparing the first test data which is read by the read control unit with second test data in the second error correction code, and when the compared first test data and second test data do not match as a result of the code comparison process, performs the error correction process to the read data or each of the divided data, and when the compared first test data and second test data match as a result of the code comparison process performed by the ECC control unit, the input/output buffer outputs the read data which is read by the read control unit, and when the compared first test data and second test data do not match as a result of the code comparison process performed by the ECC control unit, the input/output buffer outputs the read data after the error correction is performed by the ECC control unit.

Preferably, when the error correction code generation process is performed to the write data, the ECC control unit generates the second error correction code by performing the error correction code generation process to the read data, and performs a first code comparison process of comparing the first test data with the second test data in the second error correction code, as the code comparison process, and when the compared first test data and second test data do not match as a result of the comparison by the first code comparison process, performs the error correction process to the read data, and when the error correction code generation process is performed to each of the divided data, the ECC control unit generates the second error correction code by performing the error correction code generation process to each of the divided data, performs a second code comparison process of comparing the first test data with the second test data in the second error correction code, for each of the divided data, as the code comparison process, and when the compared first test data and second test data do not match as a result of the comparison by the second code comparison process, performs the error correction process to each of the divided data.

Preferably, the read control unit is configured to continuously perform a plurality of read requests to the memory cell array, and before the data read process and the code read process to a predetermined one of the read requests ends, the read control unit starts execution of the data read process and the code read process to a next read request at a time point when it becomes possible to perform the data read process and the code read process to the next read request.

According to the nonvolatile semiconductor memory device of above aspects, the databank and the ECC bank are incorporated in the same memory cell array, input write data is transferred to both the write control unit and the ECC control unit, and the error correction code generation process is performed in parallel with the data write process. Therefore, a time required for the write process can be "a processing time of the data write process" plus "a processing time of the code write process". In a case of Publicly Known Document 1, a time required for the write process is "a processing time of the data write process" plus "a processing time of the error correction code generation process" plus "a processing time of the code write process". Therefore, in the nonvolatile semiconductor memory device of the above aspects, the time required for the error correction code generation process can be shortened.

Particularly, in the RRAM, as described above, a speed of the data write process is faster than that of other memories, and the time required for the error correction code generation process gives a large influence to the processing time of an overall write process. That is, according to the nonvolatile semiconductor memory device of the above aspects, it is possible to shorten the time of the error correction code generation process that gives a large influence to the processing speed of the overall write process.

In the read process of the nonvolatile semiconductor memory device of the above aspects, instead of performing a normal error detection process, when the device is configured such that the second error correction code is generated by performing an error correction code generation process to the read data or to each of the divided data, that a code comparison process of comparing the first test data generated at a write process time with the second test data in the second error correction code is performed, that it is determined that an error is not detected when the compared data as a result of the code comparison process match, and that it is determined that an error is detected when the compared data as a result of the code comparison process do not match, that is, when the device is configured to perform an encode process and a code comparison process having a relatively short processing time, in place of the error detection process or the error detection and correction process having a very long processing time, a time required for the read process can be shortened as a whole while maintaining high reliability.

More specifically, when there is no error in the read data or the divided data, a conventional nonvolatile semiconductor memory device performs the error detection process or the error detection and correction process of a long processing time. On the other hand, the nonvolatile semiconductor memory device of the above aspects performs two processes of the encode process and the code comparison process of a short processing time, and a substantial time reduction of the processing time can be expected. Meanwhile, when there is an error in the read data or the divided data, a conventional nonvolatile semiconductor memory device performs the error detection process and the error correction process. On the other hand, the nonvolatile semiconductor memory device of the above aspects performs the error correction code generation process, the code comparison process, and the error detection process and the error correction process (or the error detection and correction process). Therefore, a processing time becomes long by a time required for the encode process and the code comparison process. Consequently, when errors occur frequently, reduction of an overall processing time cannot be expected. However, when a usual error occurrence rate of the RRAM is considered, reduction of an overall processing time can be expected, when the nonvolatile semiconductor memory device of the above aspects performs the encode process plus the code comparison process of a short processing time instead of performing a calculation (an error detection process) of code words of a very long processing time.

DESCRIPTION OF THE PREFERRED EMBODIMENTS

A nonvolatile semiconductor memory device according to embodiments of the present invention (hereinafter, appropriately abbreviated as "device of the present invention") is described below with reference to the drawings.

<First Embodiment>

A device according to a first embodiment of the present invention is described with reference to FIGS. 1 to 4.

First, a configuration of a device 1 of the present invention is described with reference to FIGS. 1 and 2. In the present embodiment, the device 1 of the present invention is configured to perform a write process SW by receiving a write request from a CPU (not shown) and perform a read process SR by receiving a read request, and further includes a burst function that continuously performs a plurality of write requests or read requests.

Figure 1:
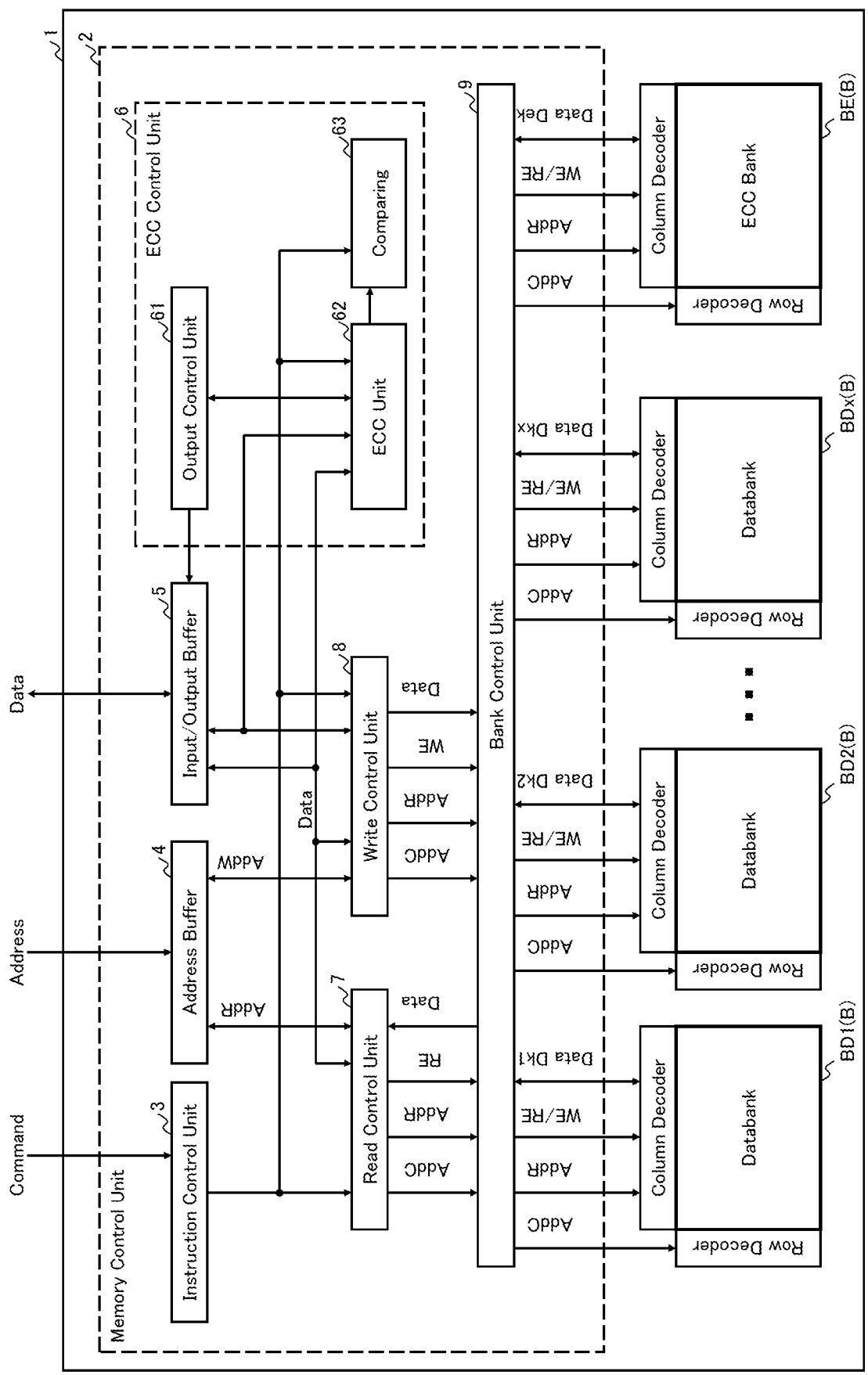
FIG. 1 is a schematic block diagram showing a schematic configuration example of a nonvolatile semiconductor memory device according to the present invention.

As shown in FIG. 1, the device 1 of the present invention is configured to include a memory cell array that includes databanks BD1 to BDx (x is an integer equal to or larger than two) for storing data and an ECC bank BE for storing an error correction code, and a memory control unit 2 that performs various controls to the memory cell array.

Figure 2:
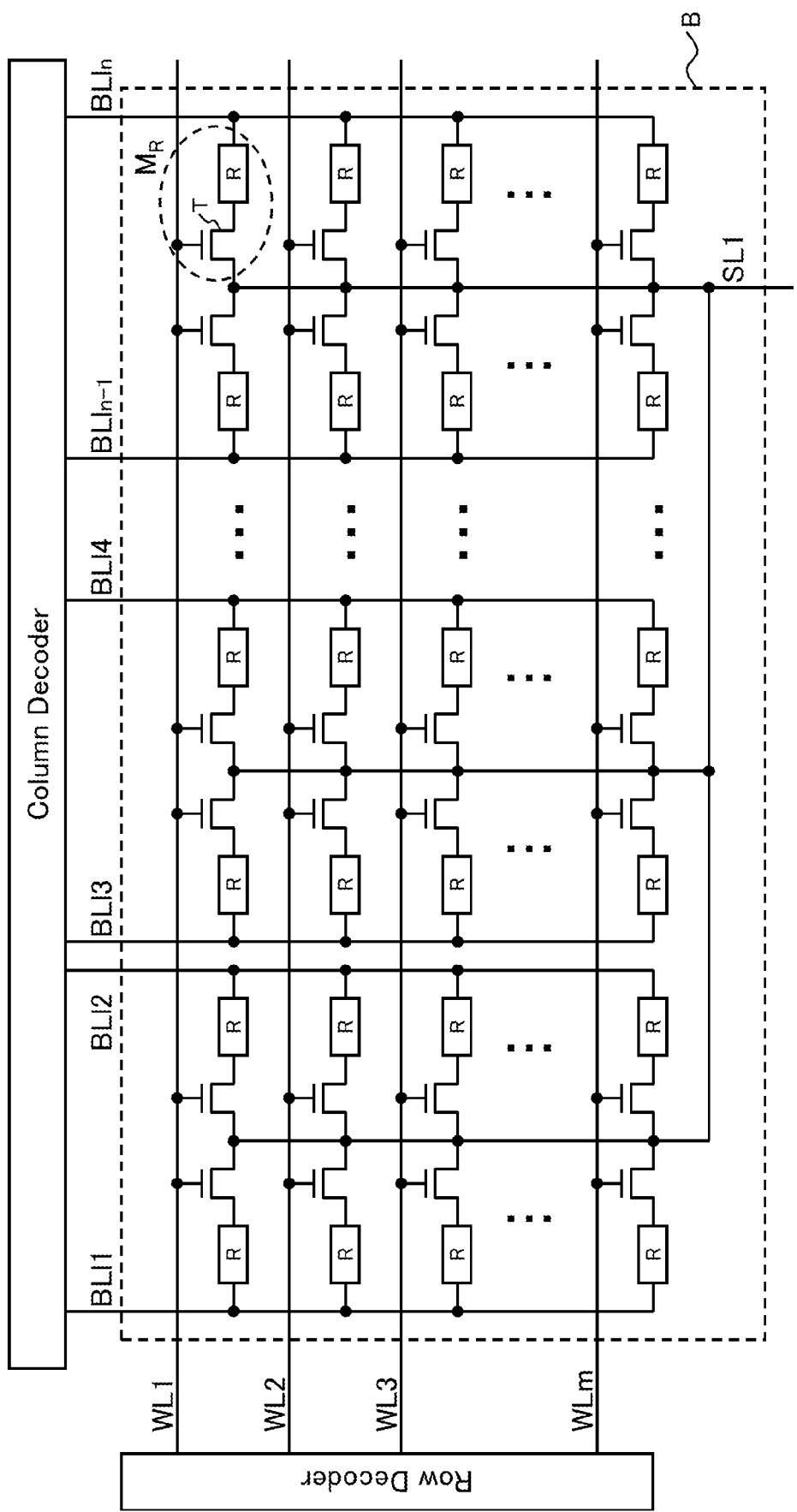
FIG. 2 is a schematic block diagram showing a schematic configuration example of a databank which is configured in the nonvolatile semiconductor memory device according to the present invention.

As shown in FIG. 2, the memory cell array is configured to include a plurality of memory cells $M_R$, each memory cell $M_R$ including one transistor T and one variable resistive element R by having one end of the variable resistive element R connected to a drain terminal of the transistor T. The memory cell $M_R$ is formed by sandwiching a variable resistor between a first electrode and a second electrode, and stores information by shifting an electric resistance of the variable resistor between a plurality of states by applying a voltage pulse between the first electrode and the second electrode (not shown).

Banks B that constitute the memory cell array, that is, the databanks BD1 to BDx and the ECC bank BE, have the same configurations in the present embodiment. The banks B have m×n memory cells $M_R$ arrayed in a matrix shape, as shown in FIG. 2. Gate terminals of the transistors T that constitute the memory cells $M_R$ of the same row are connected to the same word line WLi (i=1 to m). The other ends of the variable resistive elements R that constitute the memory cells $M_R$ of the same column are connected to the same bit line BL1$j$ (l=1 to x, and j=1 to n). Source terminals of the transistors T that constitute all memory cells $M_R$ of the banks B are connected in common to a source line SL1. Note that, the source line may be configured for each bit line BL1$j$. In each bank B, there are provided a row decoder that applies a voltage to the word lines WLi (i=1 to m) based on a control from a bank control unit 9, and a column decoder that applies a voltage to the bit lines BL1$j$ (l=1 to x, and j=1 to n) based on a control from a bank control unit 9.

Each bank B of the present embodiment is configured to switch between selection and non-selection of the memory cell $M_R$, based on a state of voltage application to a gate terminal of the transistor T, and switch between operations (a program operation, a read operation, an erase operation) of the memory cell $M_R$, based on a state of voltage application to the other end of the variable resistive element R. Note that, to switch between a program operation and an erase operation, there are a method of applying voltage pulses of different polarities, a method of applying voltage pulses of different pulse widths, and a method of switching between load resistance characteristics of a load circuit. It is arbitrary to decide which one of the methods is to be used.

Note that, in the present embodiment, it is assumed that addresses ($A_{c1+(l-1)}$, $A_{c2+(l-1)}$, are allocated to the databank BD1. However, allocation of addresses is not limited to this.

The memory control unit 2 is configured to include an address buffer 4 that receives a write address and a read address, an input/output buffer 5 that receives write data in units of bits the number of which is set in advance and that outputs read data which is read from the memory cell array, a read control unit 7 that performs a control of the read process SR to the memory cell array via the bank control unit 9, a write control unit 8 that performs a control of the write process SW to the memory cell array via the bank control unit 9, an ECC control unit 6 that performs an encode process (an error correction code generation process) SE that generates an error correction code of a predetermined system and an error correction process, and an instruction control unit 3 that receives a write request and a read request, and performs a control of the read control unit 7, the write control unit 8, and the ECC control unit 6.

Note that, the input/output buffer 5 may be configured by a data input unit that includes an input buffer and the like, and a data output unit that includes an output buffer and the like, for example.

<Write Process>

The write process SW of the device 1 of the present invention is described with reference to FIG. 3. In the present embodiment, a case where the encode process SW of generating an error correction code is performed to the write data DW is described. Further, a case where a plurality of write requests CW1 to CWh are continuously performed by a bust function is described.

Upon receiving the write requests CW1 to CWh to the memory cell array issued from the CPU, the instruction control unit 3 first starts execution of a write process SW1, by controlling the write control unit 8 and the ECC control unit 6, based on the write request CW1.

When write data DW1 is inputted to the input/output buffer 5, the write data DW1 is transferred from the input/output buffer 5 to the write control unit 8 and an ECC unit 62 of the ECC control unit 6. When a write address is inputted to the address buffer 4, the write address is transferred from the address buffer 4 to the write control unit 8.

Figure 3:
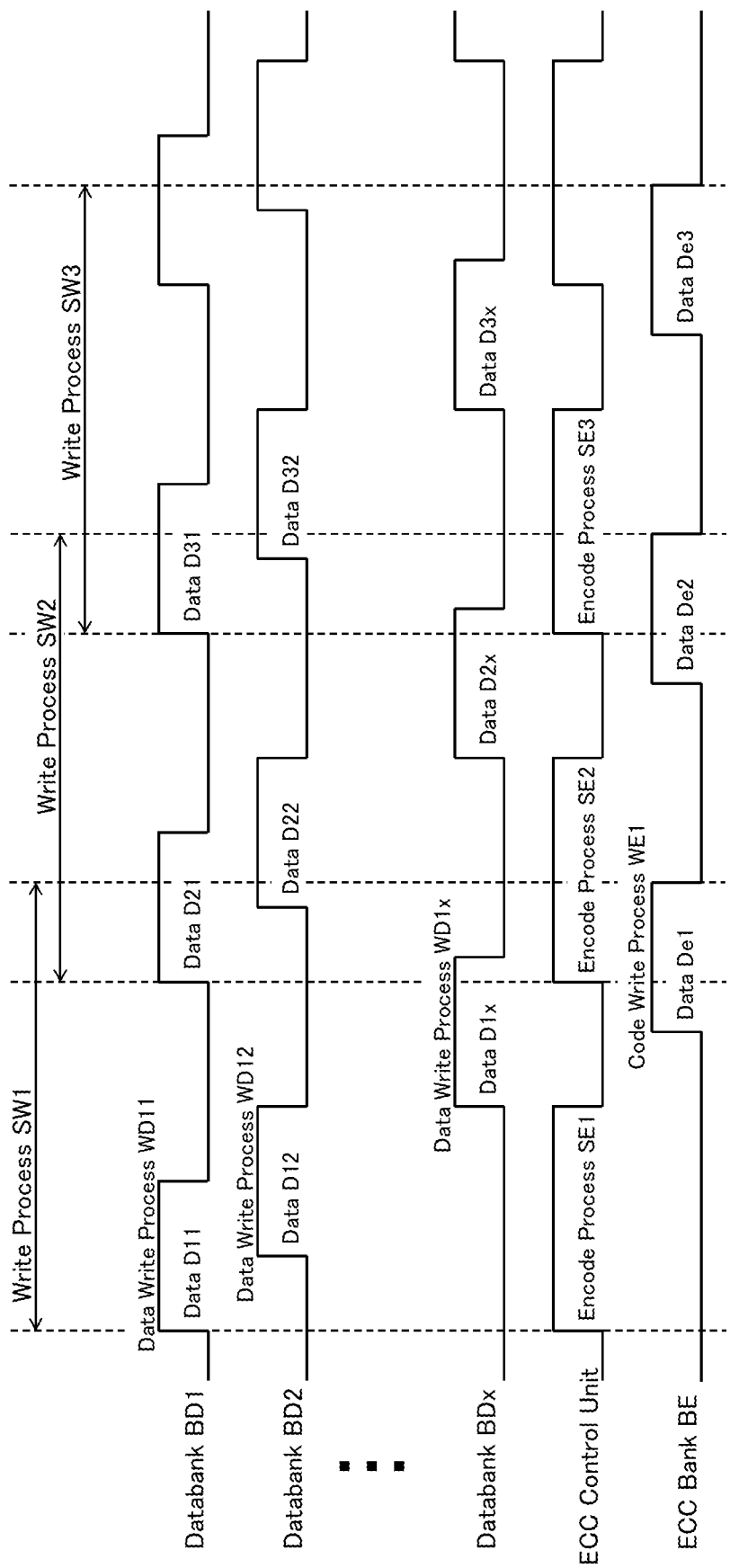
FIG. 3 is a timing chart showing a flow of a write process of the nonvolatile semiconductor memory device according to the present invention.

As shown in FIG. 3, in the write process SW1, the write control unit 8 performs a data divide process of dividing the write data DW1 transferred from the input/output buffer 5 into a predetermined number of data and generating divided data D11 to D1x, and transfers the generated divided data D11 to D1x to the bank control unit 9. Herein, a time required for the data divide process is very short as compared with a time required for a data write process WD and a code write process WE, and is therefore, not shown in FIG. 3. As shown in FIG. 3, the write control unit 8 performs data write processes WD11 to WD1x of sequentially writing the divided data D11 to D1x into the databanks BD1 to BDx, based on a write address assigned by a write request, via the bank control unit 9.

In the ECC control unit 6, as shown in FIG. 3, in parallel with the data write processes WD11 to WD1x via the bank control unit 9 by the write control unit 8, the ECC unit 62 generates a first error correction code by performing an encode process SE1 to the write data DW1, and transfers first test data De1 in the first error correction code, to the write control unit 8. Here, in the present embodiment, although the ECC control unit 6 performs the encode process SE by using a BCH (BOSE-Chaudhuri-Hocquenghem) code, the ECC control unit 6 may perform the encode process SE by using a Reed-Solomon code or an LDPC (Low Density Parity Check) code.

Upon receiving the first test data De1 from the ECC control unit 6, the write control unit 8 performs a code write process WE1 of writing the first test data De1 into the ECC bank BE, following the data write processes WD11 to WD1x, via the bank control unit 9. The instruction control unit 3 ends the write process SW1, after ending the code write process.

In the present embodiment, as shown in FIG. 3, the instruction control unit 3 starts execution of data write processes WD21 to WD2x of divided data D21 to D2x and an encode process SE2, at a time point when the data write processes WD21 to WD2x of the divided data D21 to D2x of write data DW2 to be written by a next write request CW2 become possible, without waiting for an end of the write process SW1. Similarly, the instruction control unit 3 performs write processes SW3 to SWh.

Note that, in the write control unit 8, data divide processes of write data DW1 to DWh may be continuously performed in parallel with other processes. In FIG. 3, although the ECC control unit 6 starts an encode process SEk (k=1 to h) simultaneously with a data write process WDk1, the ECC control unit 6 may continuously perform the encode processes SE1 to SEh in parallel with other processes.

<Read Process>

The read process SR of the device 1 of the present invention is described with reference to FIG. 4. In the read process SR, the case of continuously performing read requests CR1 to CRh is described, in a similar manner to that of the write process SW.

Upon receiving the read requests CR1 to CRh to the memory cell array issued from the CPU, the instruction control unit 3 first starts execution of a read process SR1 by controlling the read control unit 7 and the ECC control unit 6, based on the read request CR1.

When a read address is inputted to the address buffer 4, the read address is transferred from the address buffer 4 to the read control unit 7.

Figure 4:
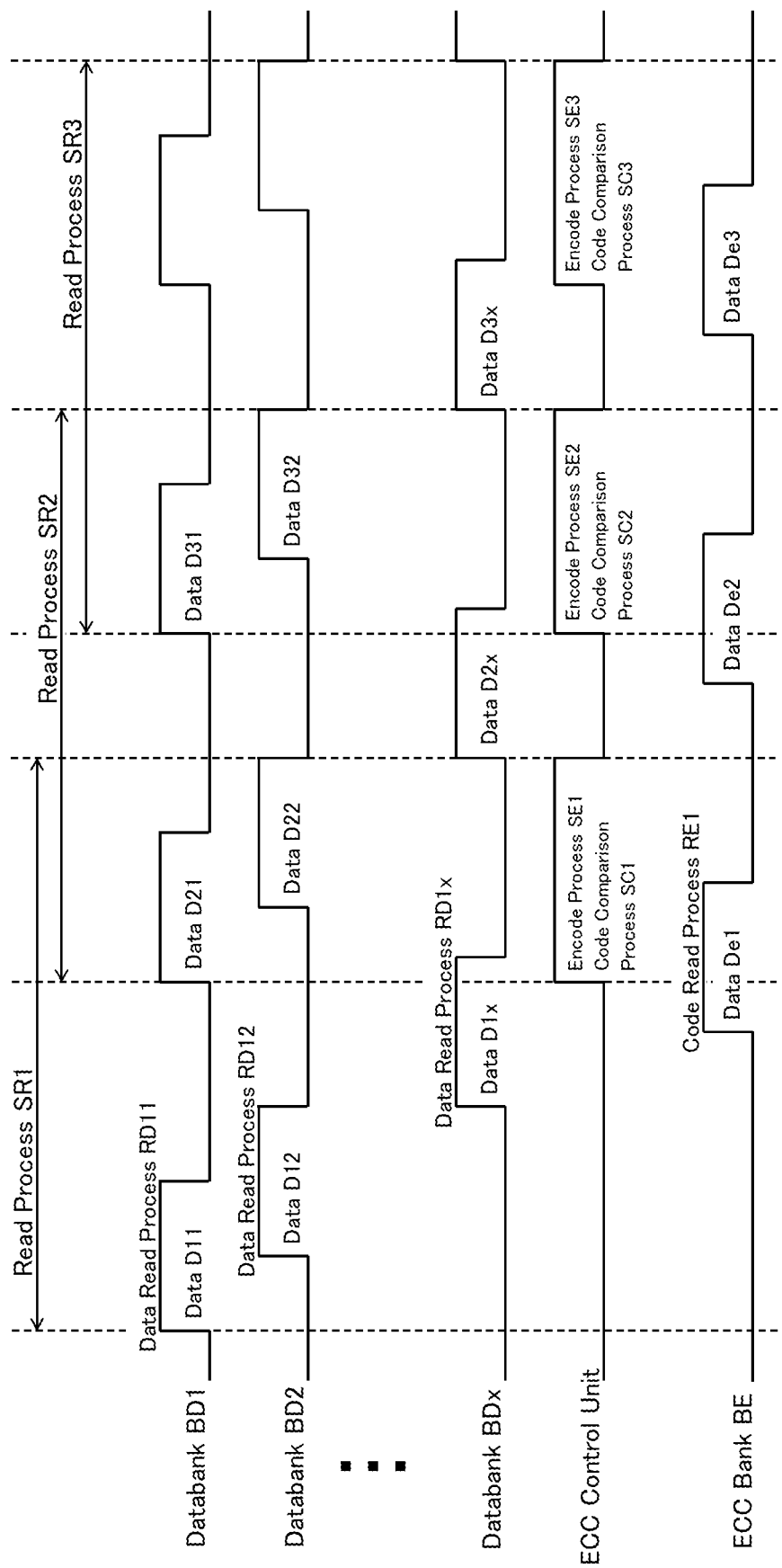
FIG. 4 is a timing chart showing a flow of a read process of the nonvolatile semiconductor memory device according to the present invention.

As shown in FIG. 4, in the read process SR1, the read control unit 7 performs data read processes RD11 to RD1x of reading each divided data from each databank via the bank control unit 9 based on the read address transferred from the address buffer 4, and transferring the read divided data to the ECC control unit 6 and the input/output buffer 5. Further, after performing the data read processes RD11 to RD1x, the read control unit 7 performs a code read process RE1 of reading the first test data De1 corresponding to read data RD1 including the divided data D11 to D1x that are read by the data read processes RD11 to RD1x, from the ECC bank BE via the bank control unit 9.

The ECC control unit 6 generates a second error correction code by performing the encode process SE1 to the read data RD1 that is read by the data read processes RD11 to RD1x. A comparing unit 63 of the ECC control unit 6 performs a code comparison process SC1 (a first code comparison process) of comparing the first test data De1 that is read by the read control unit 7 with second test data De1' in the second error correction code.

When the compared data do not match as a result of the code comparison process SC1 performed by the comparing unit 63, the ECC control unit 6 performs an error detection process and an error correction process to the read data RD1, by using a code word including the read data RD1 and the first test data De1.

When the compared data do not match as a result of the code comparison process SC1, an output control unit 61 of the ECC control unit 6 transfers read data RD1' after performing the error correction process, to the input/output buffer 5, and substitutes the read data RD1 with the read data RD1'. When the compared data match as a result of the code comparison process SC1, or when the compared data do not match as a result of the code comparison process SC1 and when the transfer of read data to the input/output buffer 5 by the ECC control unit 6 ends, the instruction control unit 3 ends the read process SR1.

In the present embodiment, as shown in FIG. 4, the instruction control unit 3 starts execution of data read processes RD21 to RD2x of the divided data D21 to D2x and the encode process SE2, at a time point when the data read processes RD21 to RD2x of the divided data D21 to D2x of read data DR2 to be read at a next read request CR2 becomes possible, without waiting for an end of the read process SR1. Similarly, the instruction control unit 3 performs read processes SR3 to SRh.

<Second Embodiment>

The device 1 according to a second embodiment of the present invention is described with reference to FIGS. 1 to 4. While a case where the encode process SW is performed to the write data DW is described in the first embodiment, a case where the encode process SW is performed to divided data Dk1 to Dkx (k=1 to h) is described in the present embodiment.

<Write Process>

The write process SW in the present embodiment is described with reference to FIG. 3. In the present embodiment, a case where a plurality of write requests CW1 to CWh are continuously performed by the burst function is described, in a similar manner to that of the first embodiment.

Upon receiving the write requests CW1 to CWh to the memory cell array issued from the CPU, the instruction control unit 3 first starts execution of the write process SW1 by controlling the write control unit 8 and the ECC control unit 6, based on the write request CW1, in a similar manner to that of the first embodiment.

When the write data DW1 is inputted to the input/output buffer 5, the write data DW1 is transferred from the input/output buffer 5 to the write control unit 8 and the ECC unit 62 of the ECC control unit 6, in a similar manner to that of the first embodiment. When a write address is inputted to the address buffer 4, the write address is transferred from the address buffer 4 to the write control unit 8.

As shown in FIG. 3, in a similar manner to that of the first embodiment, in the write process SW1, the write control unit 8 performs a data divide process of dividing the write data DW1 transferred from the input/output buffer 5 into a predetermined number of data and generating the divided data D11 to D1x, transfers the generated divided data D11 to D1x to the bank control unit 9, and performs the data write processes WD11 to WD1x of sequentially writing the divided data D11 to D1x into the databanks BD1 to BDx, based on a write address assigned by a write request, via the bank control unit 9.

In the ECC control unit 6, in the present embodiment, in parallel with the data write processes WD11 to WD1x, the ECC unit 62 generates a first error correction code by performing encode processes SE11 to SE1x to the divided data D11 to D1x respectively, and transfers a first test data group De1" including first test data De11 to De1x in the first error correction code, to the write control unit 8.

Upon receiving the first test data group De1" from the ECC control unit 6, the write control unit 8 performs the code write process WE1 of writing the first test data group De1" into the ECC bank BE, following the data write processes WD11 to WD1x, via the bank control unit 9. The instruction control unit 3 ends the write process SW1, after ending the code write process.

In a similar manner to that of the first embodiment, the instruction control unit 3 starts execution of the data write processes WD21 to WD2x of the divided data D21 to D2x and encode processes SE21 to SE2x, at a time point when the data write processes WD21 to WD2x of the divided data D21 to D2x of the write data DW2 to be written by the next write request CW2 become possible, without waiting for an end of the write process SW1. Similarly, the instruction control unit 3 performs the write processes SW3 to SWh.

<Read Process>

The read process SR in the present embodiment is described with reference to FIG. 4. In the read process SR, the case of continuously performing the read requests CR1 to CRh is described, in a similar manner to that of the write process SW.

In a similar manner to that of the first embodiment, upon receiving the read requests CR1 to CRh to the memory cell array issued from the CPU, the instruction control unit 3 first starts execution of the read process SR1 by controlling the read control unit 7 and the ECC control unit 6, based on the read request CR1.

When a read address is inputted to the address buffer 4, the read address is transferred from the address buffer 4 to the read control unit 7.

In a similar manner to that of the first embodiment, as shown in FIG. 4, in the read process SR1, the read control unit 7 performs the data read processes RD11 to RD1x of reading each divided data from each databank via the bank control unit 9 based on the read address transferred from the address buffer 4, and transferring the read divided data to the ECC control unit 6 and the input/output buffer 5.

Further, after performing the data read processes RD11 to RD1x, the read control unit 7 in the present embodiment performs the code read process RE1 of reading the first test data group De1" corresponding to the divided data D11 to D1x, from the ECC bank BE via the bank control unit 9.

The ECC control unit 6 sequentially receives the divided data D11 to D1x from the read control unit 7, and generates a second error correction code by performing the encode processes SE11 to SE1x to the divided data D11 to D1x, each time when receiving the divided data D11 to D1x. The comparing unit 63 of the ECC control unit 6 performs a code comparison process SC1l (a second code comparison process) of comparing first test data De1l (l=1 to x) of the first test data group De1" that is read by the read control unit 7 with second test data De1l' in the corresponding second error correction code.

When the compared data do not match as a result of the code comparison process SC1l performed by the comparing unit 63, the ECC control unit 6 performs an error detection process and an error correction process to the divided data D1l, by using a code word including the divided data D1l and first test data De1l'.

When the compared data do not match as a result of the code comparison process SC1l, the output control unit 61 of the ECC control unit 6 transfers divided data D1l' after performing the error correction process, to the input/output buffer 5, and substitutes the divided data D1l in the read data RD1 with the divided data D1l'. When the compared data match as a result of the code comparison process SC1x to the last divided data D1x, or when the compared data do not match as a result of the code comparison process SC1x to the last divided data D1x and when transfer of divided data D1x' to the input/output buffer 5 ends, the instruction control unit 3 ends the read process SR1.

In a similar manner to that of the first embodiment, as shown in FIG. 4, the instruction control unit 3 starts execution of the data read processes RD21 to RD2x of the divided data D21 to D2x and the encode process SE2, at a time point when the data read processes RD21 to RD2x of the divided data D21 to D2x of the read data DR2 to be read at the next read request CR2 becomes possible, without waiting for an end of the read process SR1. Similarly, the instruction control unit 3 performs the read processes SR3 to SRh.

<Other Embodiments>

(1) In the first and second embodiments, although the bank control unit 9 which is common to the databanks BD1 to BDx and to the ECC bank BE is provided, it can be arranged such that the databank control unit 9 is provided for the databanks BD1 to BDx and that an ECC bank BE control unit is provided for the ECC bank BE.

In this case, because the data write processes WD11 to WD1x to the databanks BD1 to BDx and the code write process DE1 to the ECC bank BE can be performed in parallel, a code write process WEk of writing first test data Dek into the ECC bank BE may be started at an arbitrary time point before ending data write processes WDk1 to WDkx, after the end of the encode process SEk.

The databank control unit 9 may be provided in a plural number. In this case, the write process WE or the read process RE corresponding to the number of the databank control units 9 can be performed simultaneously.

(2) In the first and second embodiments, a case where the memory cell array includes the memory cells $M_R$ of a 1T1R structure that includes one transistor T and one variable resistive element R is described. However, the structure is not limited to this. The memory cells may be cross-point type memory cells or memory cells of a 1D1R structure in which a variable resistive element and a diode are connected in series, for example.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising:
    a memory cell array that includes a plurality of memory cells each including a variable resistive element which has a variable resistor sandwiched between a first electrode and a second electrode and stores information by shifting an electric resistance of the variable resistor between a plurality of states by applying a voltage pulse between the first electrode and the second electrode;
    an input/output buffer that receives write data in units of bits the number of which is set in advance, and that outputs read data which is read from the memory cell array; and
    a memory control unit that includes a write control unit which controls a write process to the memory cell array, a read control unit which controls a read process to the memory cell array, and an ECC control unit which performs an error correction code generation process of generating an error correction code of a predetermined system and an error correction process,
    the memory cell array including a predetermined number of databanks that store data, and an ECC bank that stores test data in the error correction code which is generated by the error correction code generation process, wherein
    upon receiving a write request to the memory cell array,
    the input/output buffer outputs the write data received, to the write control unit and the ECC control unit,
    the write control unit generates divided data by dividing the write data into a predetermined number of data, and performs a data write process of writing the divided data to each of the databanks, based on a write address which is assigned by the write request,
    the ECC control unit generates a first error correction code by performing the error correction code generation process to either the write data or each of the divided data, in parallel with the data write process in the write control unit, and transfers first test data in the first error correction code to the write control unit, and
    the write control unit receives the first test data from the ECC control unit, and performs a code write process of writing the first test data into the ECC bank.

2. The nonvolatile semiconductor memory device according to claim 1, wherein
    when the error correction code generation process is performed to the write data, the write control unit performs a first code write process of writing the test data in the first error correction code to the write data, into the ECC bank, as the code write process, and when the error correction code generation process is performed to each of the divided data, the write control unit performs a second code write process of writing the test data in the first error correction code which is generated for each of the divided data, into the ECC bank, as the code write process.

3. The nonvolatile semiconductor memory device according to claim 2, wherein
    the write control unit is configured to continuously perform a plurality of write requests to the memory cell array, and before the data write process and the code write process to a predetermined one of the write requests ends, the write control unit starts execution of the data write process and the code write process to a next write request at a time point when it becomes possible to perform the data write process and the code write process to the next write request.

4. The nonvolatile semiconductor memory device according to claim 2, wherein
    when a read request to the memory cell array is received,
    the read control unit performs a data read process of reading each of the divided data from each of the databanks based on a read address assigned by the read request and transferring the read divided data to the ECC control unit, and after the execution of the data read process, performs a code read process of reading the first test data corresponding to read data including the divided data which are read in the data read process or to each of the divided data, from the ECC bank,
    the ECC control unit generates a second error correction code by performing the error correction code generation process to the read data or each of the divided data which is read in the data read process, performs a code comparison process of comparing the first test data which is read by the read control unit with second test data in the second error correction code, and when the compared first test data and second test data do not match as a result of the code comparison process, performs the error correction process to the read data or each of the divided data, and when the compared first test data and second test data match as a result of the code comparison process performed by the ECC control unit, the input/output buffer outputs the read data which is read by the read control unit, and when the compared first test data and second test data do not match as a result of the code comparison process performed by the ECC control unit, the input/output buffer outputs the read data after the error correction is performed by the ECC control unit.

5. The nonvolatile semiconductor memory device according to claim 4, wherein
when the error correction code generation process is performed to the write data, the ECC control unit generates the second error correction code by performing the error correction code generation process to the read data, and performs a first code comparison process of comparing the first test data with the second test data in the second error correction code, as the code comparison process, and when the compared first test data and second test data do not match as a result of the comparison by the first code comparison process, performs the error correction process to the read data, and
when the error correction code generation process is performed to each of the divided data, the ECC control unit generates the second error correction code by performing the error correction code generation process to each of the divided data, performs a second code comparison process of comparing the first test data with the second test data in the second error correction code, for each of the divided data, as the code comparison process, and performs the error correction process to each of the divided data.

6. The nonvolatile semiconductor memory device according to claim 5, wherein
the read control unit is configured to continuously perform a plurality of read requests to the memory cell array, and before the data read process and the code read process to a predetermined one of the read requests ends, the read control unit starts execution of the data read process and the code read process to a next read request at a time point when it becomes possible to perform the data read process and the code read process to the next read request.

7. The nonvolatile semiconductor memory device according to claim 4, wherein
the read control unit is configured to continuously perform a plurality of read requests to the memory cell array, and before the data read process and the code read process to a predetermined one of the read requests ends, the read control unit starts execution of the data read process and the code read process to a next read request at a time point when it becomes possible to perform the data read process and the code read process to the next read request.

8. The nonvolatile semiconductor memory device according to claim 1, wherein
the write control unit is configured to continuously perform a plurality of write requests to the memory cell array, and before the data write process and the code write process to a predetermined one of the write requests ends, the write control unit starts execution of the data write process and the code write process to a next write request at a time point when it becomes possible to perform the data write process and the code write process to the next write request.

9. The nonvolatile semiconductor memory device according to claim 1, wherein
when a read request to the memory cell array is received, the read control unit performs a data read process of reading each of the divided data from each of the databanks based on a read address assigned by the read request and transferring the read divided data to the ECC control unit, and after the execution of the data read process, performs a code read process of reading the first test data corresponding to read data including the divided data which are read in the data read process or to each of the divided data, from the ECC bank,
the ECC control unit generates a second error correction code by performing the error correction code generation process to the read data or each of the divided data which is read in the data read process, performs a code comparison process of comparing the first test data which is read by the read control unit with second test data in the second error correction code, and when the compared first test data and second test data do not match as a result of the code comparison process, performs the error correction process to the read data or each of the divided data, and
when the compared first test data and second test data match as a result of the code comparison process performed by the ECC control unit, the input/output buffer outputs the read data which is read by the read control unit, and when the compared first test data and second test data do not match as a result of the code comparison process performed by the ECC control unit, the input/output buffer outputs the read data after the error correction is performed by the ECC control unit.

10. The nonvolatile semiconductor memory device according to claim 9, wherein
when the error correction code generation process is performed to the write data, the ECC control unit generates the second error correction code by performing the error correction code generation process to the read data, and performs a first code comparison process of comparing the first test data with the second test data in the second error correction code, as the code comparison process, and when the compared first test data and second test data do not match as a result of the comparison by the first code comparison process, performs the error correction process to the read data, and
when the error correction code generation process is performed to each of the divided data, the ECC control unit generates the second error correction code by performing the error correction code generation process to each of the divided data, performs a second code comparison process of comparing the first test data with the second test data in the second error correction code, for each of the divided data, as the code comparison process, and when the compared first test data and second test data do not match as a result of the comparison by the second code comparison process, performs the error correction process to each of the divided data.

11. The nonvolatile semiconductor memory device according to claim 10, wherein
the read control unit is configured to continuously perform a plurality of read requests to the memory cell array, and before the data read process and the code read process to a predetermined one of the read requests ends, the read control unit starts execution of the data read process and the code read process to a next read request at a time point when it becomes possible to perform the data read process and the code read process to the next read request.

12. The nonvolatile semiconductor memory device according to claim 9, wherein
the read control unit is configured to continuously perform a plurality of read requests to the memory cell array, and before the data read process and the code read process to a predetermined one of the read requests ends, the read control unit starts execution of the data read process and the code read process to a next read request at a time point when it becomes possible to perform the data read process and the code read process to the next read request.

* * * * *